US011742178B2

(12) United States Patent
Kamoshida et al.

(10) Patent No.: US 11,742,178 B2
(45) Date of Patent: Aug. 29, 2023

(54) ION MILLING DEVICE AND MILLING PROCESSING METHOD USING SAME

(71) Applicant: Hitachi High-Tech Corporation, Tokyo (JP)

(72) Inventors: Hitoshi Kamoshida, Tokyo (JP); Hisayuki Takasu, Tokyo (JP); Atsushi Kamino, Tokyo (JP); Shota Aida, Tokyo (JP); Megumi Nakamura, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 3 days.

(21) Appl. No.: 17/637,728

(22) PCT Filed: Aug. 23, 2019

(86) PCT No.: PCT/JP2019/033147
§ 371 (c)(1),
(2) Date: Feb. 23, 2022

(87) PCT Pub. No.: WO2021/038650
PCT Pub. Date: Mar. 4, 2021

(65) Prior Publication Data
US 2022/0293391 A1 Sep. 15, 2022

(51) Int. Cl.
*H01J 37/305* (2006.01)
*H01J 37/08* (2006.01)
(Continued)

(52) U.S. Cl.
CPC .......... *H01J 37/3056* (2013.01); *H01J 37/08* (2013.01); *H01J 37/20* (2013.01); *H01J 37/304* (2013.01);
(Continued)

(58) Field of Classification Search
CPC .. H01J 37/08; H01J 37/09; H01J 37/20; H01J 37/304; H01J 37/3056; H01J 37/3447;
(Continued)

(56) References Cited

U.S. PATENT DOCUMENTS 7,700,917 B1 * 4/2010 Galloway ........... H01J 37/3053
250/492.21
2003/0232258 A1 12/2003 Yamamoto et al.
(Continued)

FOREIGN PATENT DOCUMENTS

JP 2004-14988 A 1/2004
JP 2005-191328 A 7/2005
(Continued)

OTHER PUBLICATIONS

International Search Report (PCT/ISA/210) issued in PCT Application No. PCT/JP2019/033147 dated Nov. 19, 2019 with English translation (four (4) pages).
(Continued)

*Primary Examiner* — Sean M Luck
(74) *Attorney, Agent, or Firm* — Crowell & Moring LLP

(57) ABSTRACT

The invention provides an ion milling device capable of cross-sectional milling on an all-solid-state battery while reducing an occurrence of a short circuit due to a redeposition film. The ion milling device includes a sample stage 5 on which a sample 8 is placed, an ion source 1 configured to emit an unfocused ion beam 4 toward the sample, a stage controller 6 configured to cause the sample stage to perform a swing operation centered on a swing axis $S_0$ set to be orthogonal to an ion beam center $B_0$ of the ion beam, and cause the sample stage to perform a sliding operation along a line of intersection between a plane (YZ plane) including the ion beam center and perpendicularly intersecting the swing axis and a sample placement surface of the sample
(Continued)

stage, in which the stage controller causes, in a first mode operation, the sample stage to perform the swing operation and the ion source to emit the ion beam to mill the sample, and causes in a second mode operation, the sample stage to perform the sliding operation and the ion source to emit the ion beam to remove sputter particles adhered again to the sample in the first mode operation.

16 Claims, 11 Drawing Sheets

(51) Int. Cl.
    *H01J 37/20*     (2006.01)
    *H01J 37/304*     (2006.01)

(52) U.S. Cl.
    CPC ............... *H01J 2237/026* (2013.01); *H01J 2237/20207* (2013.01); *H01J 2237/24535* (2013.01)

(58) Field of Classification Search
    CPC ........... H01J 37/32623; H01J 37/32651; H01J 2237/026; H01J 2237/045; H01J 2237/083; H01J 2237/0835; H01J 2237/1502; H01J 2237/20207; H01J 2237/20214; H01J 2237/20; H01J 2237/228; H01J 2237/24535; H01J 2237/30483; H01J 2237/30488; H01J 2237/30494; H01J 2237/31711
    See application file for complete search history.

(56) References Cited

U.S. PATENT DOCUMENTS

| | | | | |
|---|---|---|---|---|
| 2008/0067443 | A1* | 3/2008 | Todoroki | G01N 1/286 250/492.21 |
| 2012/0126146 | A1* | 5/2012 | Kaneko | H01J 37/20 250/515.1 |
| 2016/0126057 | A1* | 5/2016 | Kaneko | H01J 37/3023 250/453.11 |
| 2016/0155602 | A1* | 6/2016 | Kamino | H01J 37/08 204/192.34 |
| 2017/0047198 | A1* | 2/2017 | Horinouchi | H01J 37/305 |
| 2018/0130630 | A1* | 5/2018 | Tani | H01J 37/30 |
| 2019/0033182 | A1* | 1/2019 | Kamino | G01N 1/32 |
| 2021/0193430 | A1 | 6/2021 | Iwaya et al. | |

FOREIGN PATENT DOCUMENTS

| | | |
|---|---|---|
| JP | 2012-156077 A | 8/2012 |
| JP | 2016-212956 A | 12/2016 |
| WO | WO 2017/145371 A1 | 8/2017 |

OTHER PUBLICATIONS

Japanese-language Written Opinion (PCT/ISA/237) issued in PCT Application No. PCT/JP2019/033147 dated Nov. 19, 2019 (four (4) pages).

Japanese-language International Preliminary Report on Patentability (PCT/EPEA/409) issued in PCT Application No. PCT/JP2019/033147 dated Apr. 22, 2021 (four (4) pages).

\* cited by examiner

[FIG. 1]
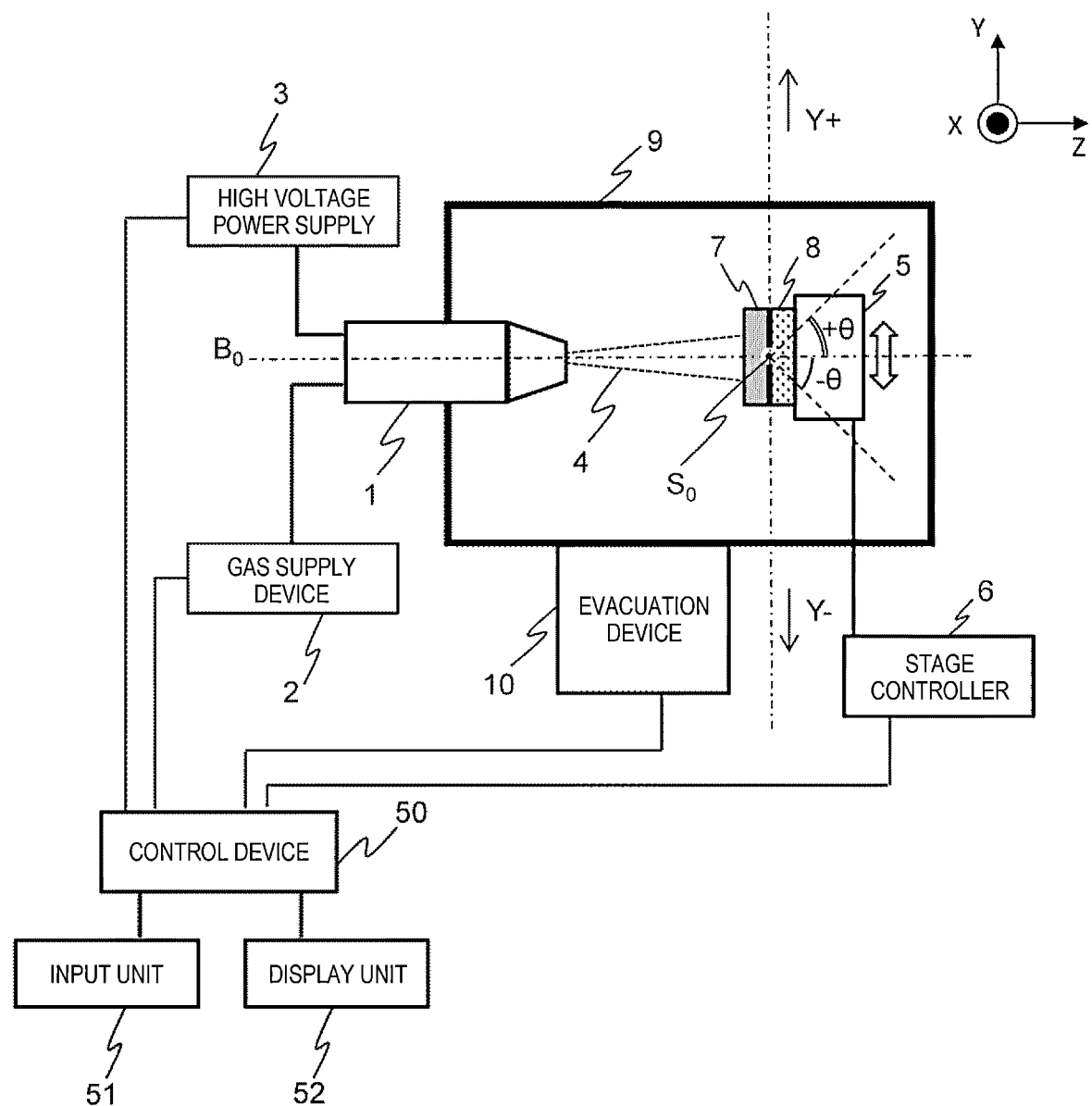

[FIG. 2]
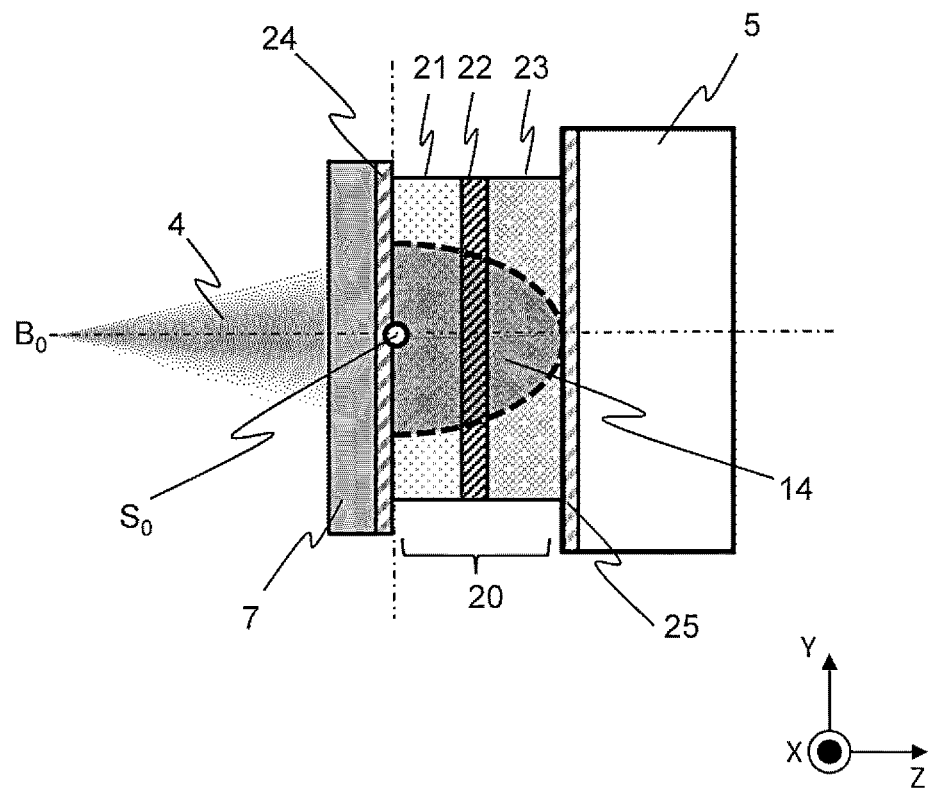
[FIG. 3]
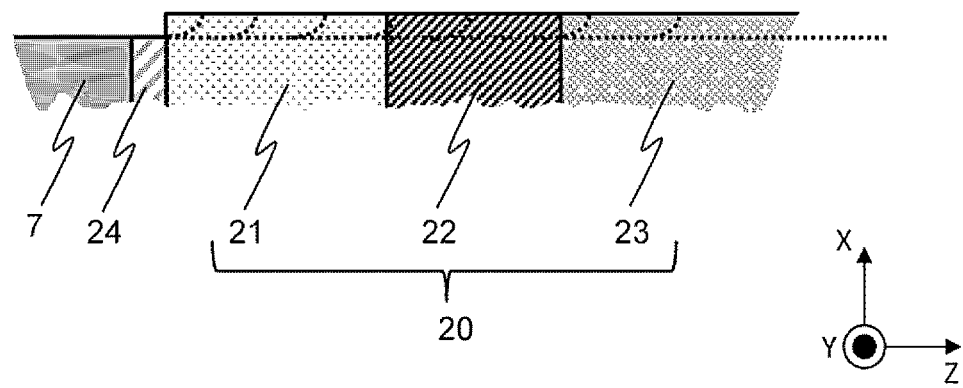

[FIG. 4]
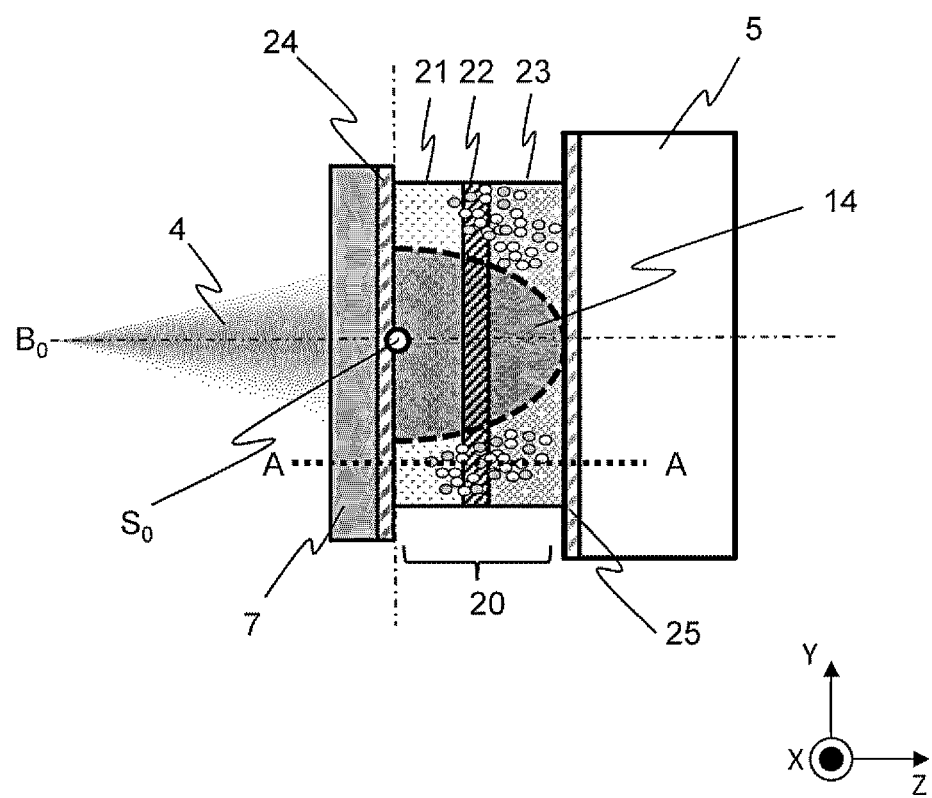

[FIG. 5]
TIME POINT T$_a$
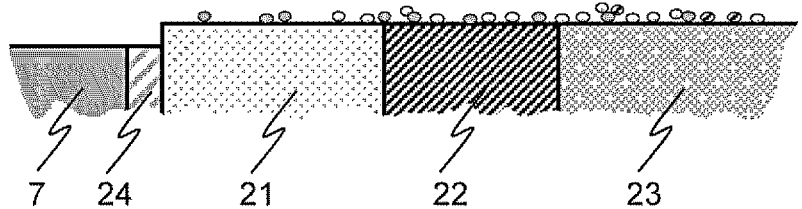
TIME POINT T$_b$
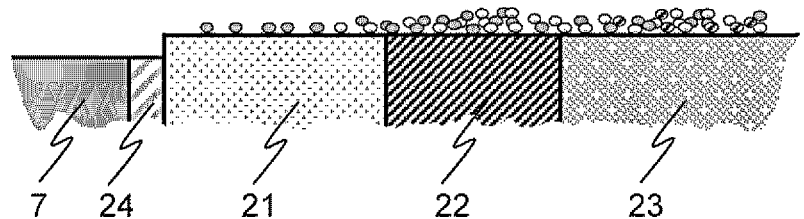
TIME POINT T$_c$
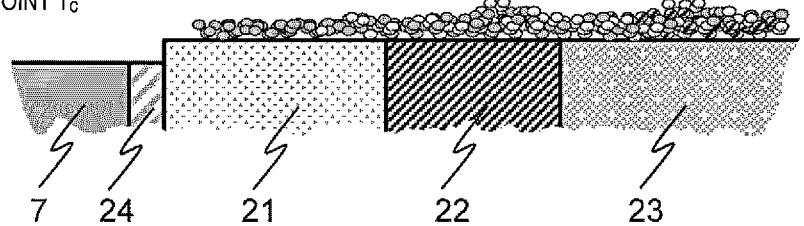
TIME ELAPSES
- ● SPATTER PARTICLES DERIVED FROM SHIELDING PLATE
- ○ SPUTTER PARTICLES DERIVED FROM POSITIVE ELECTRODE MATERIAL
- ◍ SPUTTER PARTICLES DERIVED FROM SOLID ELECTROLYTE
- ○ SPUTTER PARTICLES DERIVED FROM NEGATIVE ELECTRODE MATERIAL
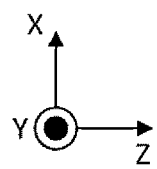

[FIG. 6]
| TIME POINT | SURFACE IMAGE | CROSS-SECTIONAL IMAGE | SHORT-CIRCUITED (SHORTED)? |
|---|---|---|---|
| $T_a$ | 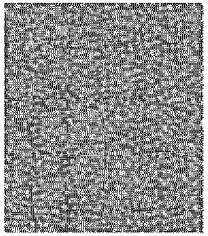 | | NO |
| $T_b$ | 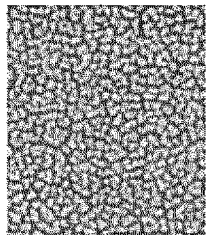 | 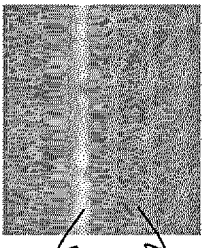 31  20 | YES |
| $T_c$ | 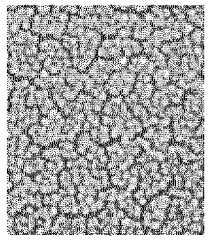 | 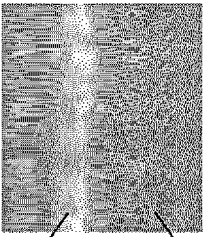 32  20 | YES |

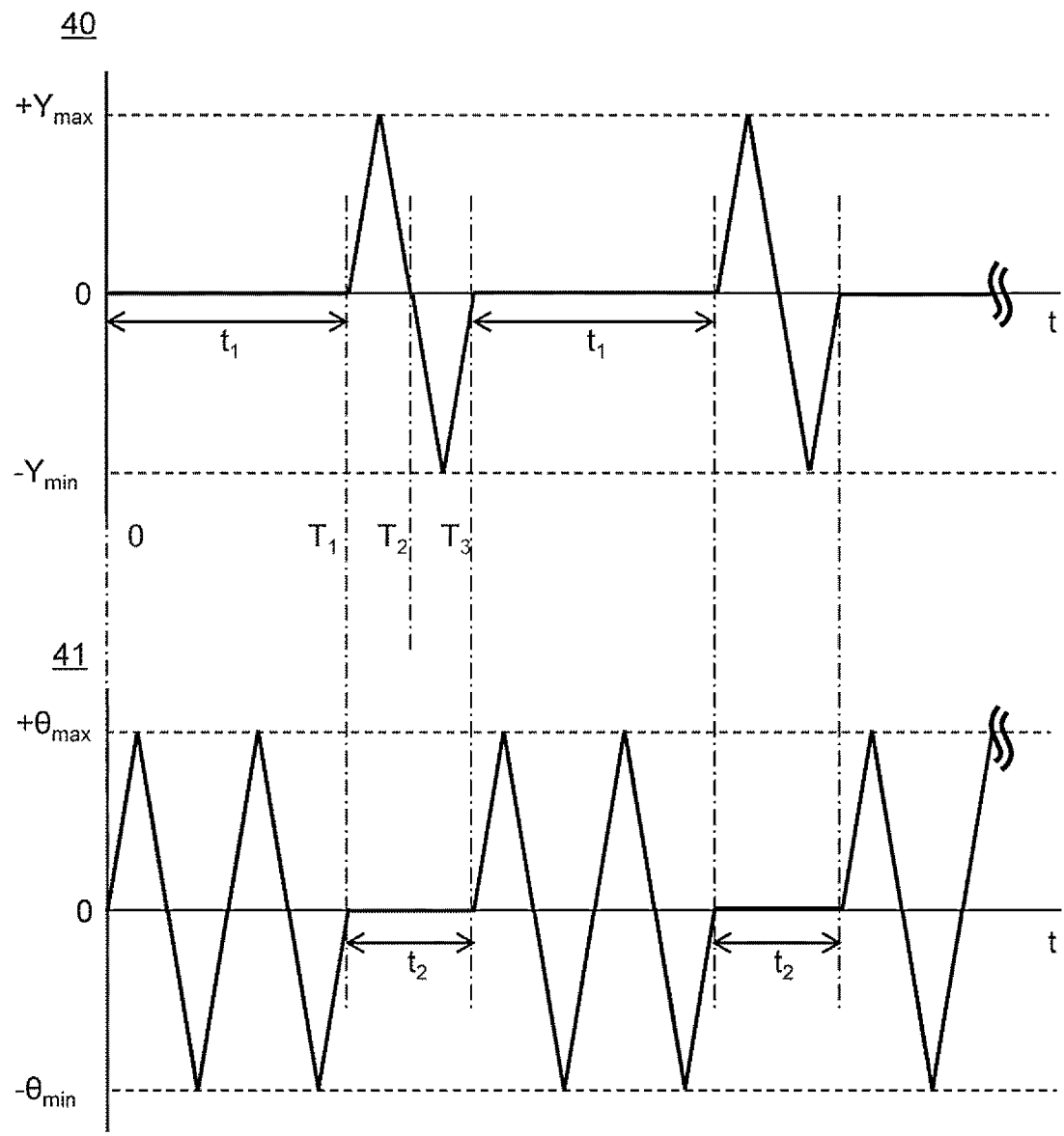
[FIG. 7A]

[FIG. 7B]
| TIME POINT | ION BEAM IRRADIATION STATE |
|---|---|
| 0 TO $T_1$ | 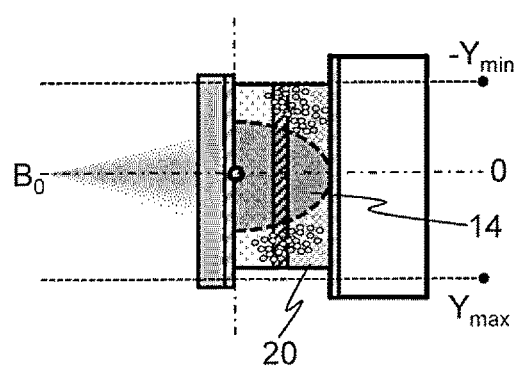 |
| $T_1$ TO $T_2$ | 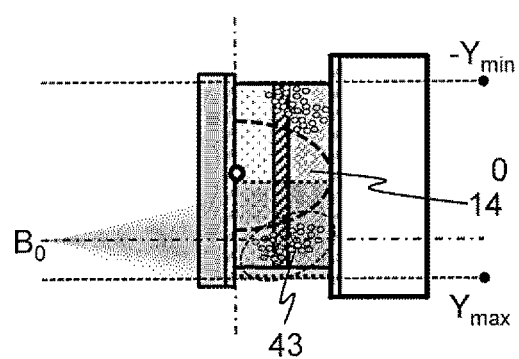 |
| $T_2$ TO $T_3$ | 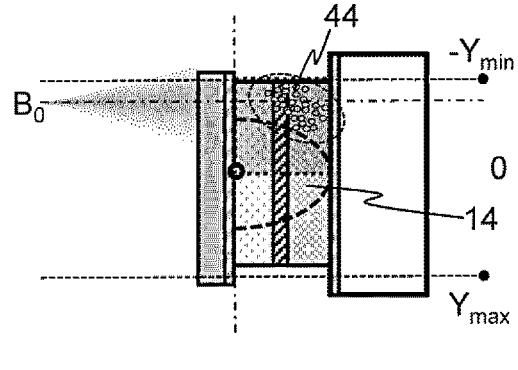 |
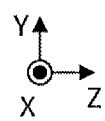

[FIG. 8]
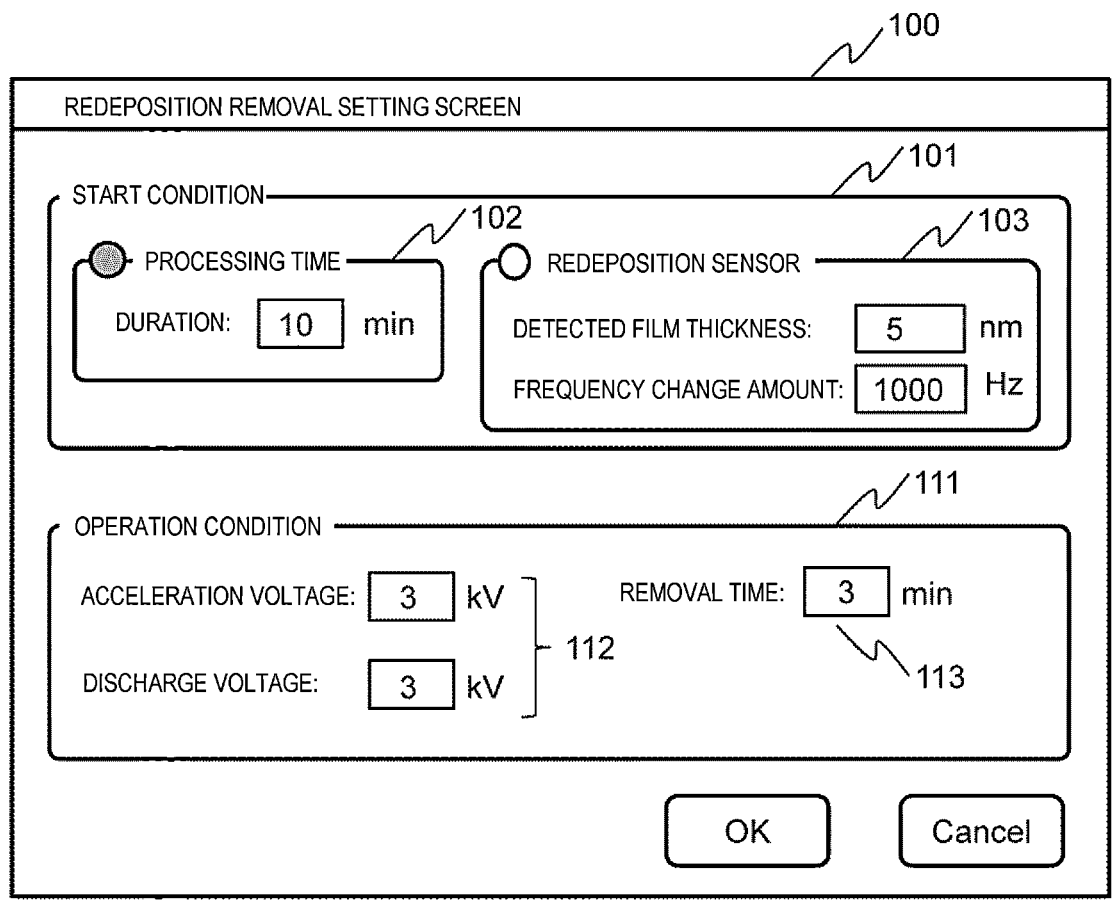

[FIG. 9]
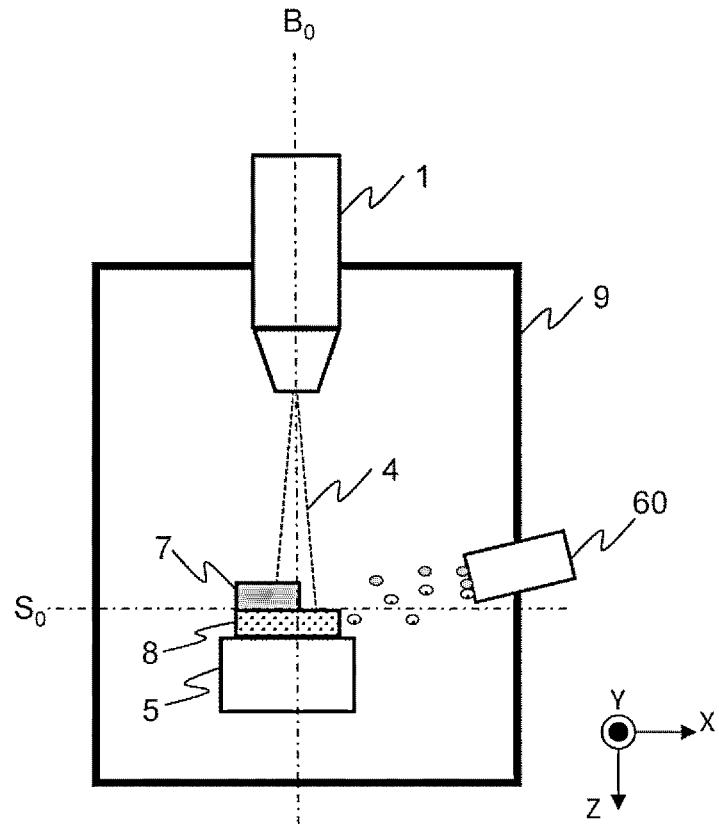
[FIG. 10A]
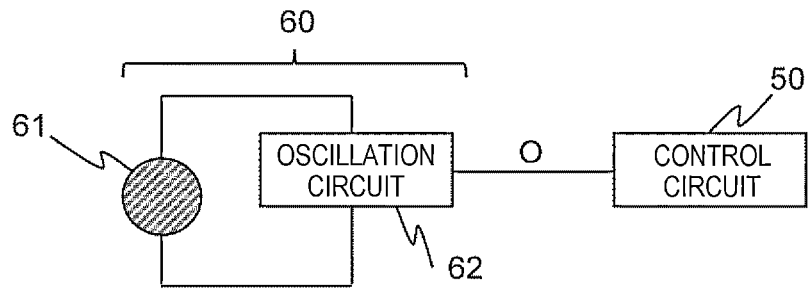
[FIG. 10B]
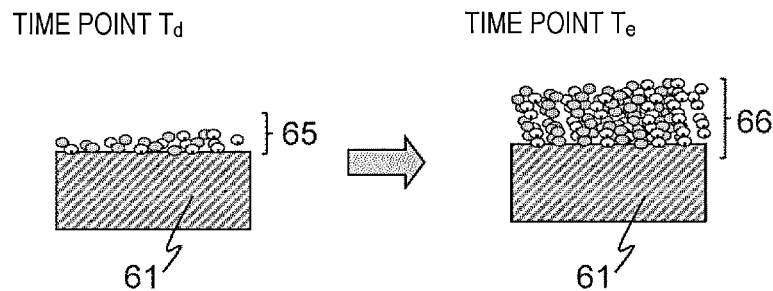

[FIG. 11]
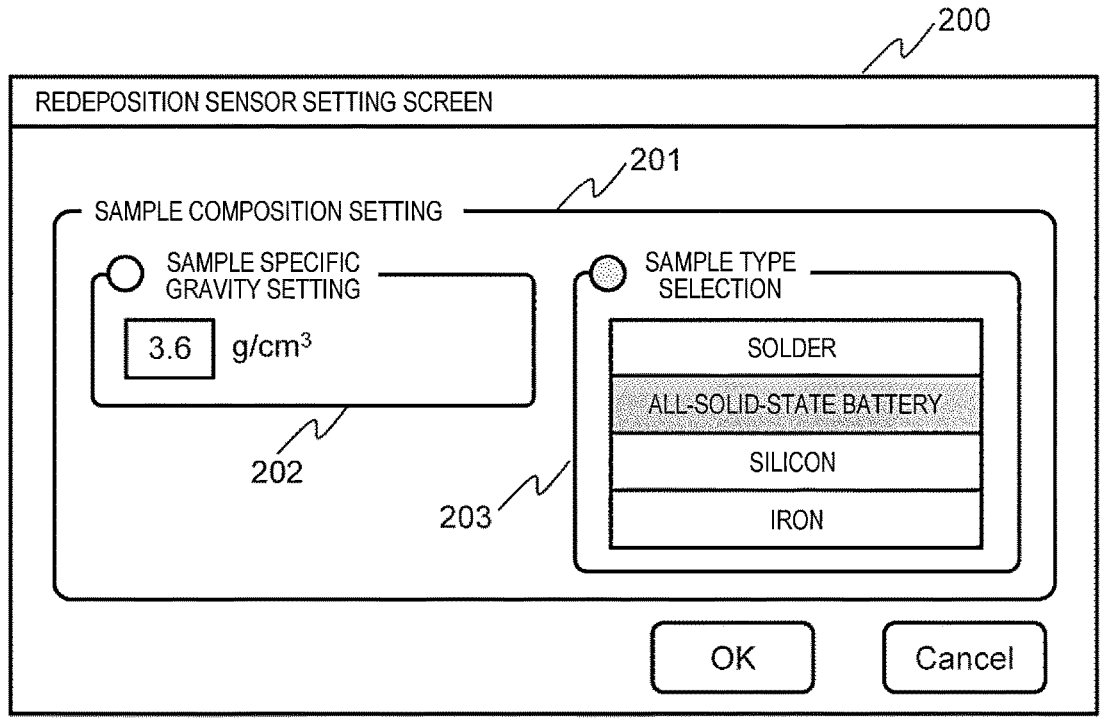
[FIG. 12]
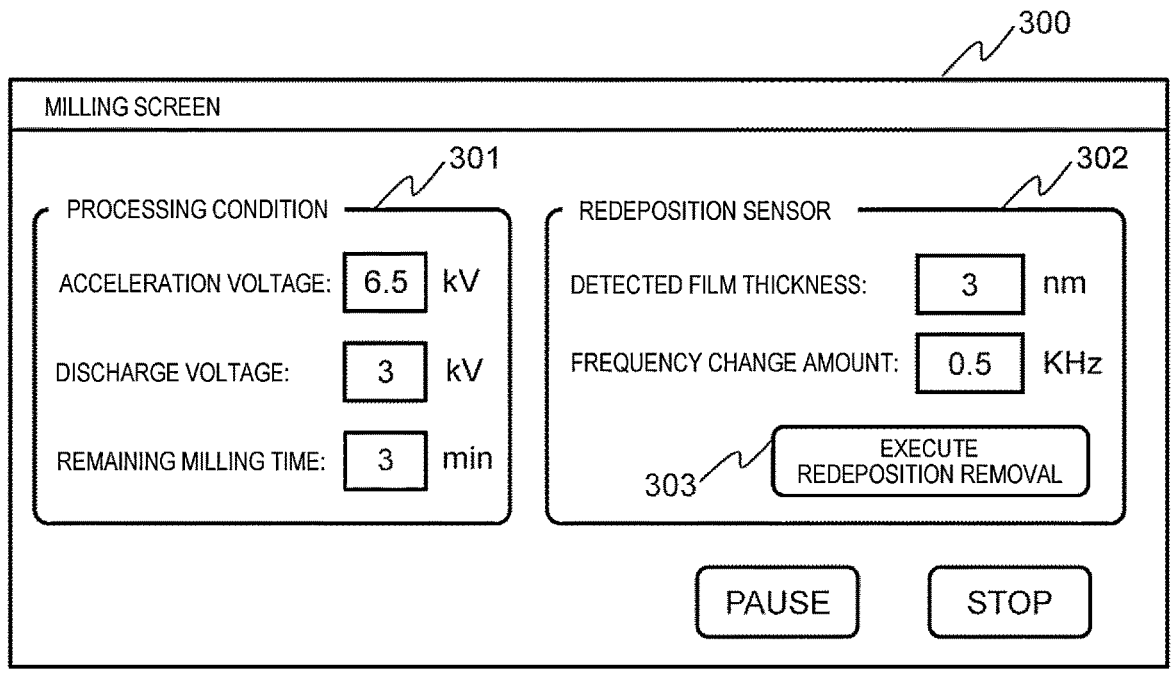

[FIG. 13]
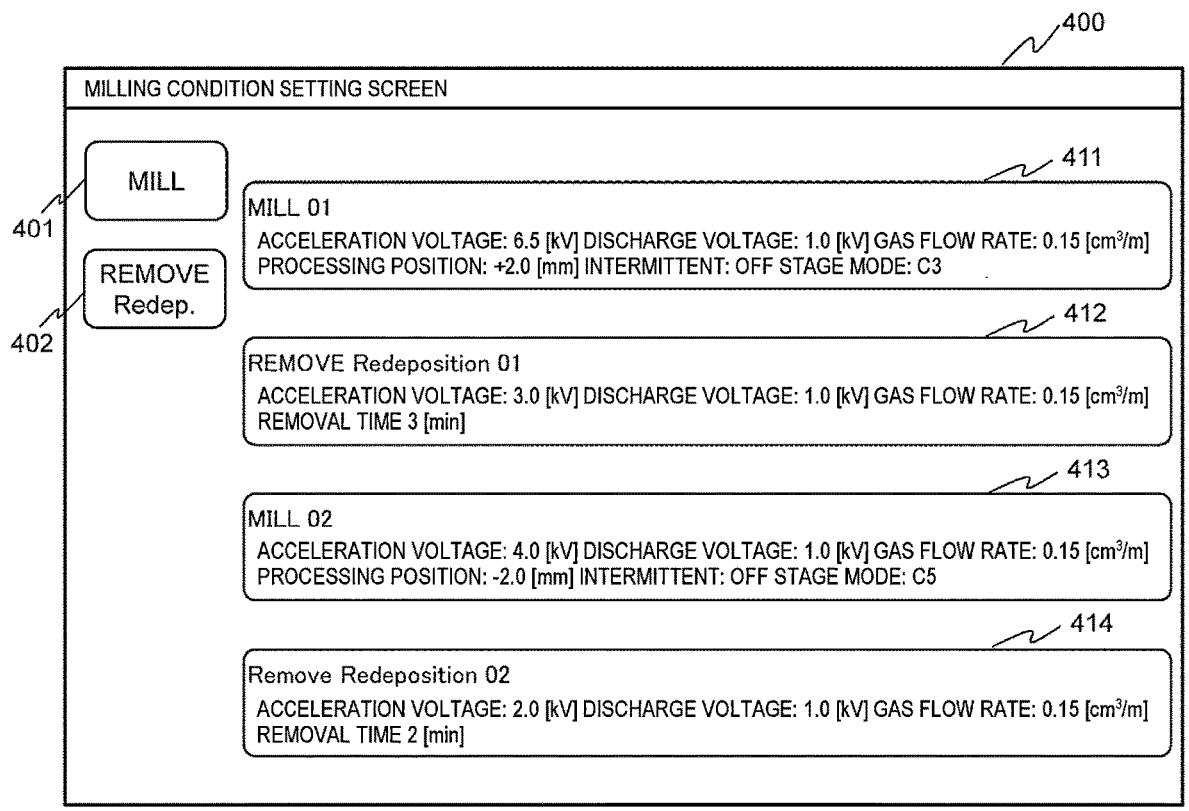
[FIG. 14]
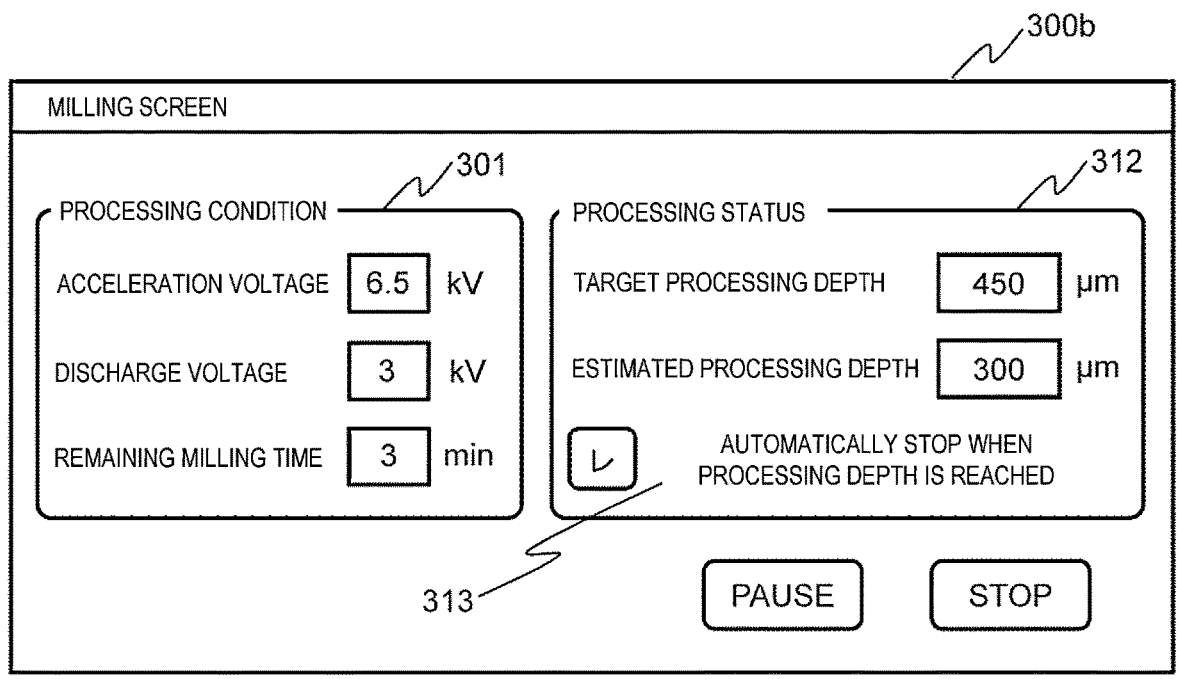

ION MILLING DEVICE AND MILLING PROCESSING METHOD USING SAME

TECHNICAL FIELD

The present invention relates to an ion milling device and a milling processing method using the ion milling device.

BACKGROUND ART

An ion milling device irradiates a surface or a cross section of a sample (for example, metals, semiconductors, glasses, and ceramic) with an unfocused ion beam (Ar ion or the like) accelerated to several kV, and flicks atoms on the surface of the sample without stress due to a sputtering phenomenon, thereby obtaining a smooth processed surface. This is an excellent property for performing smoothing for observing the surface or the cross section of the sample with an electron microscope represented by a scanning electron microscope (SEM) or a transmission electron microscope (TEM).

Since the ion milling device irradiates the sample with the ion beam in a vacuum atmosphere for processing, an ion source that generates the ion beam, the sample, a sample holder that holds the sample, and a sample stage on which the sample holder is provided are provided in a sample chamber where evacuation can performed. When the sample chamber is evacuated and then the sample is irradiated with the ion beam from the ion source, fine particles that are flicked (sputtered) from an ion beam irradiation surface of the sample or another structure (for example, the sample holder or the sample stage) adhere to a vicinity of the ion beam irradiation surface of the sample. This is referred to as redeposition.

PTL 1 discloses an ion milling device including a slide moving mechanism that slides and moves, in a direction including a normal direction component of an axis of an ion beam, a sample holding portion that holds a sample. The ion milling device in PTL 1 can perform a milling processing on a plurality of points of the sample by the slide moving mechanism (multi-point milling). In the case, when a second processed surface is milled after a first processed surface is milled, fine particles may adhere to the first processed surface. Therefore, PTL 1 discloses that in the multi-point milling, a movement between the first processed surface and the second processed surface is performed a plurality of times, and after the second processed surface is milled, the first processed surface is milled at least once to reduce the redeposition to a plurality of processed surfaces.

CITATION LIST

Patent Literature

PTL 1: WO 2017/145371

SUMMARY OF INVENTION

Technical Problem

At present, lithium ion batteries, which are widely used as secondary batteries, use an organic electrolyte as an electrolyte, whereas all-solid-state batteries use an inorganic solid electrolyte as an electrolyte. Therefore, the all-solid-state batteries have been developed actively due to characteristics that the all-solid-state batteries have high safety and reliability without a risk of liquid leakage or ignition, and have an excellent cycle life, and in a bulk type all-solid-state battery, a battery capacity is increased by introducing an electrode active material into an electrode material. Meanwhile, since a conduction path of lithium ions is a solid electrolyte having no fluidity in the all-solid-state batteries, it is necessary to study not only physical properties of the electrode material and the electrolyte individually, but also physical properties of an electrode active material-electrolyte solid interface. By exposing a cross section of an all-solid-state battery having a structure of positive electrode material-solid electrolyte-negative electrode material, and observing the cross section using, for example, an electron microscope or a scanning probe microscope, structural evaluation and physical property evaluation including the interface are possible.

However, when a cross-section processing is performed on the all-solid-state battery by the ion milling device, the fine particles (sputter particles) that are flicked from the ion beam irradiation surface contain a large amount of conductive fine particles such as particles derived from a conductive positive electrode material and a conductive negative electrode material, and particles derived from a metal component such as a sample holder. As an ion beam irradiation time elapses, an adhesion amount of the fine particles increases due to the redeposition, and the fine particles (referred to as "redeposition particles" or "redeposited particles") are deposited to form a film (referred to as "redeposition film" or "redeposited film"). Since the redeposited film contains a large amount of conductive fine particles, when the redeposited film has a certain thickness, the redeposited film also serves as a conductive film, and the positive electrode material and the negative electrode material of the all-solid-state battery undergoing the cross-section processing are electrically connected to each other, that is, short-circuited (shorted). When the short circuit occurs between the electrodes, a state of the all-solid-state battery is different from a state originally desired to be observed, and the structural evaluation and the physical property evaluation cannot be performed.

Therefore, when the cross-section processing is performed on the all-solid-state battery by the ion milling device, it is necessary to reduce an occurrence of the short circuit (short) due to the redeposited film. PTL 1 discloses that the redeposition to the processed surfaces is reduced, but does not disclose that redeposition to regions other than the processed surfaces is reduced.

Solution to Problem

An ion milling device according to an aspect of the invention includes: a sample stage on which a sample is placed; an ion source configured to emit an unfocused ion beam toward the sample; a stage controller configured to cause the sample stage to perform a swing operation centered on a swing axis set to be orthogonal to an ion beam center of the ion beam, and cause the sample stage to perform a sliding operation along a line of intersection between a plane including the ion beam center and perpendicularly intersecting the swing axis and a sample placement surface of the sample stage; and a control device configured to repeat a first mode operation and a second mode operation to mill the sample. The sample is disposed so as to protrude from a shielding plate that shields the ion beam toward a direction of the swing axis, and the control device causes, in the first mode operation, the sample stage to perform the swing operation and causes the ion source to emit the ion beam to mill the sample, and in the second mode operation, the sample stage to perform the sliding operation and causes the ion source to emit the ion beam to remove sputter particles adhered again to the sample in the first mode operation.

A milling processing method according to another aspect of the invention includes milling an all-solid-state battery disposed on a sample stage so as to protrude from a shielding plate that shields an unfocused ion beam toward a direction of a swing axis by using an ion milling device. The ion milling device includes an ion source configured to emit the ion beam, the sample stage, and a stage controller configured to cause the sample stage to perform a swing operation centered on the swing axis set to be orthogonal to an ion beam center of the ion beam, and cause the sample stage to perform a sliding operation along a line of intersection between a plane including the ion beam center and perpendicularly intersecting the swing axis and a sample placement surface of the sample stage. A condition is set for a second mode operation. According to the set condition for the second mode operation, a first mode operation and the second mode operation are repeated to mill the all-solid-state battery. In the first mode operation, the sample stage is caused to perform the swing operation and the ion source is caused to emit the ion beam to mill the all-solid-state battery, and in the second mode operation, the sample stage is caused to perform the sliding operation and the ion source is caused to emit the ion beam to remove sputter particles adhered again to the all-solid-state battery in the first mode operation.

Advantageous Effect

The invention provides the ion milling device capable of cross-sectional milling on an all-solid-state battery by reducing the occurrence of a short circuit due to a redeposition film.

Other technical problems and novel characteristics will be apparent from a description of the description and the accompanying drawings.

BRIEF DESCRIPTION OF DRAWINGS

FIG. 1 is an overall configuration diagram of an ion milling device.
FIG. 2 is a diagram showing an object of the invention.
FIG. 3 is a diagram showing the object of the invention.
FIG. 4 is a diagram showing the object of the invention.
FIG. 5 is a diagram showing the object of the invention.
FIG. 6 is a diagram showing the object of the invention.
FIG. 7A is a time chart of a stage control.
FIG. 7B is a diagram showing an ion beam irradiation state during a milling processing.
FIG. 8 is an example of a GUI screen.
FIG. 9 is an outline of an ion milling device according to a second embodiment.
FIG. 10A is a configuration example of a redeposition sensor.
FIG. 10B is a diagram showing a state in which a redeposition film is formed on a quartz resonator.
FIG. 11 is an example of a GUI screen.
FIG. 12 is an example of the GUI screen.
FIG. 13 is an example of the GUI screen.
FIG. 14 is an example of the GUI screen.

DESCRIPTION OF EMBODIMENTS

Novel characteristics and effects of the invention will be described with reference to the drawings. However, the present embodiment is merely an example for implementing the invention, and does not limit the technical scope of the invention. Further, in the drawings, common components are denoted by the same reference numerals.

FIG. 1 is a diagram (schematic diagram) showing a main part of an ion milling device. A sample chamber 9 is provided with an ion source 1, and a sample stage 5 on which a sample 8 to be processed is placed. The sample chamber 9 is provided with an evacuation device 10, and an inside of the sample chamber 9 is maintained in a vacuum atmosphere when the sample 8 is being processed. Further, in order to partially shield an ion beam 4 from the ion source 1 and perform cross-sectional milling on the sample 8, a shielding plate (mask) 7 is placed on an upper surface (here, referred to as a surface facing the ion source 1) of the sample 8.

The ion beam 4 from the ion source 1 irradiates the sample 8 placed on a sample placement surface of the sample stage 5 in a state of spreading in a Gaussian distribution centering on an ion beam center $B_0$. As the ion source 1, for example, a penning discharge type ion source can be used. When a discharge voltage is applied from a high voltage power supply 3, a penning discharge occurs between an anode and a cathode inside the ion source 1. Electrons generated by the penning discharge collide with a gas (for example, Ar gas) supplied from a gas supply device 2 to generate cations (Ar ions). The generated cations are accelerated by an acceleration voltage applied from the high voltage power supply 3, and are emitted as the ion beam 4 to an outside of the ion source 1. The penning discharge type ion source includes a magnetic field generator such as a permanent magnet that applies a magnetic field to a plasma generation chamber formed by the cathode and the anode obtained by division into two, and the magnetic field bends an orbit of the electrons generated by the penning discharge and causes the electrons to perform a turning movement. Since the orbit of the electrons is longer due to the turning movement of the electrons and discharge efficiency can be improved, there is an advantage that the ion source can be compactly achieved. In the drawing, a Z axis coincides with the ion beam center $B_0$, and a plane perpendicular to the Z axis is defined as an XY plane.

FIG. 1 shows a state in which the sample placement surface of the sample stage 5 is perpendicular to the ion beam center $B_0$, and the sample stage 5 can be controlled by a stage controller 6 to change an irradiation state of the ion beam 4 on the sample 8. The stage controller 6 can execute a swing operation and a sliding operation on the sample stage 5.

The sample stage 5 has, on the upper surface of the sample 8, a swing axis $S_0$ orthogonal to the ion beam center $B_0$ extending in the Z direction, and extending in an X direction. The sample stage 5 can perform a rotation operation (swing operation) about the swing axis $S_0$ by a predetermined angle $\theta$ in each of a Y+ direction and a Y− direction under the control of the stage controller 6. The rotation angle in the Y+ direction may be different from the rotation angle in the Y− direction. In addition, the sample placement surface of the sample stage 5 can perform a moving operation (sliding operation) by a predetermined distance in each of the Y+ direction and the Y− direction under the control of the stage controller 6. The sliding operation can be performed even when the sample placement surface of the sample stage 5 is not perpendicular to the ion beam center $B_0$. In the case, the sliding operation is performed in a direction along a line of intersection between a sample placement surface and an YZ plane.

The ion milling device includes a control device 50, and the control device 50 controls each mechanism of the ion milling device to perform a milling processing on the sample 8. The control device 50 is connected to an input unit 51 including an input key for setting conditions of the ion milling device and the like, and a display unit 52 for displaying a GUI for setting conditions and an operating state of the device during the milling processing. The input unit 51 and the display unit 52 may be integrated by a touch panel.

Hereinafter, an object in the case of performing the cross-sectional milling on an all-solid-state battery as the sample 8 will be described. FIG. 2 shows a state in which the cross-sectional milling is performed on an all-solid-state battery 20 by the ion milling device shown in FIG. 1. The all-solid-state battery 20 has a structure in which a solid electrolyte 22 is sandwiched between a positive electrode material 21 and a negative electrode material 23. The all-solid-state battery 20 may have a structure in which the above structure is further laminated on a plurality of layers. Generally, since the shielding plate 7 and the sample placement surface of the sample stage 5 are made of a metal, in order to prevent the all-solid-state battery 20 from short-circuiting, an insulating material 24 is provided on a lower surface (here, referred to as a surface facing the sample placement surface of the sample stage 5) of the shielding plate 7, and an insulating material 25 is provided on the sample placement surface of the sample stage 5. The insulating material 24 and the insulating material 25 can be formed as a resin layer or a metal oxide coating layer (alumite or the like).

FIG. 3 shows a positional relationship between the all-solid-state battery 20 and the shielding plate 7 by changing an orientation in the XY direction with respect to the paper surface in FIG. 2. As shown in FIG. 3, the all-solid-state battery 20 is disposed so as to slightly protrude from the shielding plate 7 toward the X direction. A cross section of the all-solid-state battery 20 can be exposed by irradiating, with the ion beam 4, only a portion of the all-solid-state battery 20 protruding from the shielding plate 7 (cross-section milling). By performing the swing operation of the sample stage 5 with the swing axis $S_0$ as a central axis during the irradiation with the ion beam 4, a processed surface (milling region) 14 by the ion beam 4 can be smoothed (see FIG. 2).

As mentioned above, redeposition occurs during the milling processing. The state is shown in FIG. 4. Sputter particles flicked from an ion beam irradiation surface are deposited in a vicinity of the milling region (processed surface) 14. Even if the flicked sputter particles re-adhere to the milling region 14, the sputter particles are not flicked again by the irradiation with the ion beam and are deposited in the milling region 14. On the other hand, the sputter particles adhering to the vicinity of the milling region 14 are deposited as a processing time elapses. The state is shown in FIG. 5.

FIG. 5 shows a deposition status of the sputter particles in a cross section (the same direction as in FIG. 3) along a line A-A shown in FIG. 4. An upper part shows the deposition status of the sputter particles at a time point $T_a$, a middle part shows the deposition status of the sputter particles at a time point $T_b$, and a lower part shows the deposition status of the sputter particles at a time point $T_c$ ($T_a < T_b < T_c$). In this way, the sputter particles are deposited to form a film as the processing time elapses. The state is shown in FIG. 6.

FIG. 6 shows a surface image and a cross-sectional image of the deposited sputter particles at the time point $T_a$, the time point $T_b$, and the time point $T_c$. At the time point $T_a$, the sputter particles are deposited in an island shape as shown in the surface image, and a short circuit of the all-solid-state battery 20 does not occur at this stage. On the other hand, at the time point $T_b$, the sputter particles are further deposited and connected to form a film, thereby forming a redeposited film 31. Further, at the time point $T_c$, a thicker redeposited film 32 is formed (see the cross-sectional image). The redeposited film is a deposit of redeposited particles having a size of several nm, and contains a large amount of sputter particles derived from a shielding plate and sputter particles derived from a positive electrode material. Since all of these sputter particles have conductivity, the redeposited film also has conductivity when a film thickness thereof reaches a certain level. Formation of such a redeposited film causes the short circuit in the all-solid-state battery 20 to be processed during the milling processing. Therefore, it is necessary to remove the deposited sputter particles before the formed redeposited film causes the short circuit in the all-solid-state battery 20.

First Embodiment

In a first embodiment, during a milling processing on an all-solid-state battery, the ion beam 4 is periodically irradiated to a vicinity of the milling region 14 to reduce formation of a redeposited film due to deposition of sputter particles. FIG. 7A shows an example of a time chart (schematic diagram) of stage control performed by the stage controller 6 during a cross-sectional milling on the all-solid-state battery. A waveform 40 is a sliding operation waveform of the sample stage 5, and a waveform 41 is a swing operation waveform of the sample stage 5. A horizontal axis indicates a time.

In order to simplify an explanation, it is assumed that at a start of milling (t=0), the ion beam center $B_0$ intersects vertically at a center position of the sample placement surface of the sample stage 5 as shown in FIG. 1, and the intersection is described as an origin. The sample stage 5 performs a sliding operation from the origin to $Y_{max}$ in a + direction (denoted as "+$Y_{max}$") and to $Y_{min}$ in a − direction (denoted as "−$Y_{min}$") in a direction along a line of intersection between a sample placement surface and the YZ plane. When an angle between a normal of the sample placement surface of the sample stage 5 and the Z axis is set as θ, the sample stage 5 performs a swing operation around the swing axis $S_0$ from the Z direction to $θ_{max}$ in the Y+ direction (denoted as "+θmax") and from the Z direction to $θ_{min}$ in the Y− direction (denoted as "−$θ_{min}$").

(1) Sample Stage Operation from Time Points 0 to $T_1$ (First Mode Operation)

At time points 0 to $T_1$ (time $t_1$), a normal cross-section milling operation is performed. During the period, the sliding operation of the sample stage 5 is not performed, but the swing operation thereof is performed to smooth a processed surface. An irradiation state of an ion beam at this time is shown in the upper part in FIG. 7B. The milling region 14 is irradiated with the ion beam, and a cross section of the all-solid-state battery 20 is exposed.

(2) Sample Stage Operation at Time Points $T_1$ to $T_3$ (Second Mode Operation)

At time points $T_1$ to $T_3$ (time $t_2$), a removing operation of redeposited particles is performed. During the period, the swing operation of the sample stage 5 is stopped, and the sputter particles adhered again to the all-solid-state battery 20 by the redeposition accompanying the cross-sectional milling operation from the time points 0 to $T_1$ are flicked by the ion beam. In the time chart in FIG. 7A, at the time point $T_1$, the ion beam center $B_0$ returns to a positional relationship perpendicular to the sample placement surface of the sample stage 5, so that the sliding operation of the sample stage 5 is performed along the Y direction.

At the time points $T_1$ to $T_2$, the sample stage 5 performs a sliding operation from 0 to $+Y_{max}$ in the Y+ direction, and then performs a sliding operation from $+Y_{max}$ to 0 in the Y− direction. The irradiation state of the ion beam at this time is shown in the middle part in FIG. 7B. Accordingly, the sputter particles 43 deposited in the vicinity of the milling region 14 are removed. A degree of the removal may be such that the deposited sputter particles can be prevented from growing into a conductive redeposited film.

At the time points $T_2$ to $T_3$, the sample stage 5 performs a sliding operation from 0 to $-Y_{min}$ in the Y− direction, and then performs a sliding operation from $-Y_{min}$ to 0 in the Y+ direction. The irradiation state of the ion beam at this time is shown in the lower part in FIG. 7B. Accordingly, the sputter particles 44 deposited in the vicinity of the milling region 14 are removed. The degree of the removal may also be such that the deposited sputter particles can be prevented from growing into a conductive redeposited film.

Hereinafter, the cross-section milling operation during the time $t_1$ (first mode operation) and the sputter particle removing operation during the time $t_2$ (second mode operation) are repeatedly performed until a desired processed surface is obtained.

FIG. 8 shows a GUI screen 100 for the control device 50 to set sputter particle removing operation conditions displayed on the display unit 52. The GUI screen 100 is displayed for setting conditions when processing a sample such as an all-solid-state battery that requires an operation of removing sputter particles deposited around a processed surface (milling region) during milling. The redeposition removal setting screen 100 shown in FIG. 8 includes a start condition setting screen 101 and an operation condition setting screen 111 for the second mode operation.

On the start condition setting screen 101, any one of time control according to the first embodiment and deposit thickness control according to a second embodiment described later can be selected. When the time control is selected, the time $t_1$ (see FIG. 7A) is specified as a duration 102 for processing (first mode operation).

On the operation condition setting screen 111, an ion beam condition 112 and the time $t_2$ (see FIG. 7A) as a removal time 113 when the sputter particle removing operation is performed are specified. Since the redeposited particles have weak bonds with surrounding particles, the redeposited particles can be flicked even with ion beams with relatively low energy. Therefore, in order to avoid heating a sample by irradiation with an ion beam having an excessive ion beam current, the ion beam current can be changed between the milling operation (first mode operation) and the sputter particle removing operation (second mode operation). Instead of the ion beam condition 112, or in addition to the ion beam condition 112, a sliding operation speed of the sample stage 5 may be controllable. By appropriately setting these conditions, it is possible to remove the sputter particles while balancing a processing throughput and a heat load on the sample (all-solid-state battery). The ion beam conditions in the first mode operation are set when milling processing conditions of the sample are set.

The stage control shown in FIG. 7A is an example and the invention is not limited thereto. For example, the milling region is not required to be a central part of the sample, and any position can be selected and processed. In the case, during a sputter particle removing operation period, the sample stage 5 may perform a sliding operation from any milling position to, for example, $+Y_{max}$ in the Y+ direction, then a sliding operation to $-Y_{min}$ in the Y− direction, and then again a sliding operation to the milling position in the Y+ direction. In FIG. 7A, a range in which the sliding operation is performed is the entire range allowed by hardware of the ion milling device, but a range in which the sliding operation is performed may be limited and set. The sliding operation is not at a constant speed, and may be performed at a lower speed in a vicinity of the milling position and at a higher speed as a distance from the milling position increases. When performing the sliding operation, the ion beam center $B_0$ may do not return to a positional relationship perpendicular to the sample placement surface of the sample stage 5. That is, the sliding operation may be performed in a state in which the normal of the sample placement surface of the sample stage 5 and the Z axis do not match each other, or the sliding operation may be performed while the swing operation continues.

Second Embodiment

In the second embodiment, at a timing when a deposition status of sputter particles caused by a milling processing on an all-solid-state battery is monitored and deposition of the sputter particles reaches a predetermined thickness, by irradiating the vicinity of the milling region 14 with the ion beam 4, formation of the redeposited film due to the deposition of the sputter particles is reduced.

FIG. 9 shows an outline of an ion milling device provided with a redeposition sensor that monitors a deposition thickness of the sputter particles caused by the milling processing. A redeposition sensor 60 is disposed in a vicinity of a milling region of the sample 8. FIG. 10A shows a configuration example of the redeposition sensor 60.

The redeposition sensor 60 includes a quartz resonator and an oscillation circuit 62, and the oscillation circuit 62 oscillates the quartz resonator 61 and outputs an oscillation signal O. The quartz resonator 61 is exposed to the sample chamber 9, and the sputter particles caused by the milling processing are deposited on the quartz resonator 61 by the milling processing performed by the ion milling device. The state is shown in FIG. 10B. A redeposited film 65 is formed on the quartz resonator 61 at a time point $T_d$, and as the milling processing is continued, the sputter particles are further deposited on the redeposited film 65 at a time point $T_e$ to form a redeposited film 66 having an increased film thickness. Since an oscillation frequency of the quartz resonator 61 changes according to a mass of the redeposited film deposited on the quartz resonator 61, a frequency $f_d$ of the oscillation signal O at the time point $T_d$ changes to $f_e$ at the time point $T_e$. The control device 50 detects, based on a change in frequency of the oscillation signal O, a change in mass of the sputter particles deposited on the quartz resonator 61, and converts the change in mass into a change amount in film thickness (mass film thickness) (that is, a difference between a film thickness of the redeposited film 66 and a film thickness of the redeposited film 65). The redeposition sensor 60 does not directly measure the sputter particles deposited in the vicinity of the milling region of the sample, but has an advantage that the deposition status of the sputter particles can be easily estimated.

A sputter particle removing operation in the second embodiment is the same as that of the first embodiment except that rigging at a start of the removing operation (second mode operation) is based on a monitoring result of redeposition of the sample, and thus the duplicate description is omitted. When the deposit thickness control according to the second embodiment is carried out, a sensing condition 103 for starting the sputter particle removing operation is set on the start condition setting screen 101 (see FIG. 8). In this example, the start condition can be set according to the film thickness detected by the redeposition sensor 60 and the frequency change amount of the oscillation signal O. Either one may be set as the start condition, or both may be set. When both the detected film thickness and the frequency change amount are set as the start condition, the sputter particle removing operation (second mode operation) is started at a timing when either one of the conditions is satisfied.

When the redeposition sensor detects the film thickness by a mass measurement method as shown in FIG. 10A, what the sensor detects is a change in mass, and even if the mass is the same, the film thickness differs depending on a material of the sample to be milled, so it is necessary to set a parameter for film thickness conversion. FIG. 11 shows a GUI screen 200 for setting the parameter for calculating the film thickness. A sample composition setting screen 201 includes a sample specific gravity setting unit 202 that directly sets a specific gravity of the sample and a sample type selection unit 203 that selects a sample type. The control device 50 stores in advance a default value of the specific gravity of the sample that can be selected in the sample type selection unit 203. When a specific sample is selected by the sample type selection unit 203, film thickness conversion is performed using the default value of the specific gravity stored in advance.

FIG. 12 shows a GUI screen 300 displayed on the display unit 52 during a milling operation of the ion milling device. On a processing condition display screen 301, an acceleration voltage, a discharge voltage, and a remaining milling time during the milling operation (the first mode operation) are displayed. On a sensing screen 302, the detected film thickness detected by the redeposition sensor 60 and the frequency change amount are displayed.

At the start of the milling operation (first mode operation), a value of the sensing screen 302 is reset to 0, and the detected film thickness and the frequency change amount during a processing are updated in real time. When a sputter particle removal start condition set on the start condition setting screen 101 (see FIG. 8) is satisfied, the sputter particle removing operation (second mode operation) is performed. At the end of the second mode operation, the value of the sensing screen 302 is reset to 0. When the milling operation (first mode operation) is restarted, the detected film thickness and the frequency change amount during the processing are updated in real time again. The sensing screen 302 is provided with a redeposition removal execution button 303. The redeposition removal execution button 303 allows an operator to execute the sputter particle removing operation (second mode operation) at any timing.

The invention is not limited to the above embodiments, and includes various modifications. For example, the above-described embodiments have been described for easy understanding of the invention, and the invention is not necessarily limited to those including all configurations described above. Parts of a configuration according to an embodiment may be replaced with a configuration according to another embodiment, and the configuration according to another embodiment can be added to the configuration according to the embodiment.

For example, since the ion milling device according to the present embodiment is provided with a slide mechanism on a sample stage, milling can be performed at a plurality of positions (multi-point milling). In this case, it is convenient if a milling condition (first mode operation condition) and a sputter particle removing operation condition (second mode operation condition) are first set respectively in advance for the plurality of positions to be processed. FIG. 13 shows a GUI screen 400 for the control device 50 to set milling conditions for a plurality of positions, which is to be displayed on the display unit 52. The operator sets a milling condition for each processing position with a milling button 401, and after setting the milling condition, sets a sputter particle removing condition for the position with a redeposition removal button 402. The setting is repeated for each processed position. The figure shows an example in which a milling condition 411 and a redeposition removal condition 412 for a first processed portion, and a milling condition 413 and a redeposition removal condition 414 for a second processed portion are set.

In the second embodiment, the ion milling device can also estimate a progress status of the milling processing based on the amount of redeposition estimated by the redeposition sensor 60. FIG. 14 is a GUI screen 300b displayed on the display unit 52 during the milling processing of the ion milling device. The GUI screen 300b displays a milling processing status estimated based on sensing of the redeposition sensor 60. In this example, a target processing depth set when the milling processing condition for the sample is set, and an estimated processing depth estimated based on the sensing of the redeposition sensor 60 are displayed on a processing status display screen 312. When an automatic stop setting unit 313 is set, the milling processing is ended at a stage where the estimated processing depth reaches a target processing depth value.

REFERENCE SIGN LIST

1 ion source
2 gas supply device
3 high voltage power supply
4 ion beam
5 sample stage
6 stage controller
7 shielding plate
8 sample
9 sample chamber
10 evacuation device
14 milling region (processed surface)
20 all-solid-state battery
21 positive electrode material
22 solid electrolyte
23 negative electrode material
24, 25 insulating material
31, 32 redeposition film
40, 41 waveform
43, 44 sputter particle
50 control device
51 input unit
52 display unit
60 redeposition sensor
61 quartz resonator
62 oscillation circuit
65, 66 redeposition film
100, 200, 300, 300b, 400 GUI screen
101 start condition setting screen
111 operation condition setting screen
201 sample composition setting screen
301 processing condition display screen 302 sensing screen
312 processing status display screen

The invention claimed is:

1. An ion milling device comprising:
a sample stage on which a sample is placed and whose sample placement surface is provided with a first insulating material;
an ion source configured to emit an unfocused ion beam toward the sample;
a shielding plate configured to shield the ion beam and provided with a second insulating material on a surface facing the sample placement surface;
a stage controller configured to cause the sample stage to perform a swing operation centered on a swing axis set to be orthogonal to an ion beam center of the ion beam, and cause the sample stage to perform a sliding operation along a line of intersection between a plane including the ion beam center and perpendicularly intersecting the swing axis and the sample placement surface of the sample stage; and
a control device configured to repeat a first mode operation and a second mode operation to mill the sample, wherein
the sample is disposed so as to be in contact with the second insulating material of the shielding plate and to protrude from the shielding plate toward a direction of the swing axis, and
the control device causes, in the first mode operation, the sample stage to perform the swing operation and the ion source to emit the ion beam to mill the sample, and causes, in the second mode operation, the sample stage to perform the sliding operation and the ion source to emit the ion beam to remove a sputter particle adhered again to the sample in the first mode operation.

2. The ion milling device according to claim 1, wherein the control device sets an ion beam current of the ion beam to different values in the first mode operation and the second mode operation.

3. The ion milling device according to claim 1, wherein the control device sets a time for executing the first mode operation and a time for executing the second mode operation.

4. The ion milling device according to claim 1, further comprising:
a sensor configured to measure an amount of sputter particles flicked by irradiating the sample with the ion beam.

5. The ion milling device according to claim 4, wherein the control device sets a condition for starting the second mode operation and a time for executing the second mode operation based on an output of the sensor.

6. The ion milling device according to claim 5, wherein the sensor includes a quartz resonator and an oscillation circuit that oscillates the quartz resonator and outputs an oscillation signal, and
the control device measures, based on a change in a frequency of the oscillation signal due to deposition of sputter particles on the quartz resonator by the milling processing, a mass of the sputter particles deposited on the quartz resonator, and estimates a film thickness of a redeposition film formed by the deposition of the sputter particles on the sample.

7. The ion milling device according to claim 6, wherein the condition for starting the second mode operation is determined by the estimated film thickness of the redeposition film or a change amount of the frequency of the oscillation signal.

8. An ion milling device comprising:
a sample stage on which a sample is placed;
an ion source configured to emit an unfocused ion beam toward the sample;
a stage controller configured to cause the sample stage to perform a swing operation centered on a swing axis set to be orthogonal to an ion beam center of the ion beam, and cause the sample stage to perform a sliding operation along a line of intersection between a plane including the ion beam center and perpendicularly intersecting the swing axis and a sample placement surface of the sample stage;
a control device configured to repeat a first mode operation and a second mode operation to mill the sample; and
a sensor configured to measure an amount of sputter particles flicked by irradiating the sample with the ion beam, wherein
the sample is disposed so as to protrude from a shielding plate that shields the ion beam toward a direction of the swing axis, and
the control device causes, in the first mode operation, the sample stage to perform the swing operation and the ion source to emit the ion beam to mill the sample, causes, in the second mode operation, the sample stage to perform the sliding operation and the ion source to emit the ion beam to remove a sputter particle adhered again to the sample in the first mode operation, and determines ending of the milling process of the sample based on an output of the sensor.

9. A milling processing method comprising:
milling an all-solid-state battery that is in contact with a second insulating material of a shielding plate and is disposed on a sample stage so as to protrude from the shielding plate toward a direction of a swing axis by using an ion milling device, wherein
the ion milling device includes
an ion source configured to emit an unfocused ion beam,
the sample stage whose sample placement surface is provided with a first insulating material,
the shielding plate configured to shield the ion beam and provided with the second insulating material on a surface facing the sample placement surface, and
a stage controller configured to cause the sample stage to perform a swing operation centered on the swing axis set to be orthogonal to an ion beam center of the ion beam, and cause the sample stage to perform a sliding operation along a line of intersection between a plane including the ion beam center and perpendicularly intersecting the swing axis and the sample placement surface of the sample stage,
a condition is set for a second mode operation,
according to the set condition for the second mode operation, a first mode operation and the second mode operation are repeated to mill the all-solid-state battery, and
in the first mode operation, the sample stage is caused to perform the swing operation and the ion source is caused to emit the ion beam to mill the all-solid-state battery, and in the second mode operation, the sample stage is caused to perform the sliding operation and the ion source is caused to emit the ion beam to remove a sputter particle adhered again to the all-solid-state battery in the first mode operation.

10. The milling processing method according to claim 9, wherein
the condition for the second mode operation includes a start condition for the second mode operation and an operation condition for the second mode operation.

11. The milling processing method according to claim 10, wherein
the operation condition for the second mode operation includes an acceleration voltage and a discharge voltage of the ion source.

12. The milling processing method according to claim 10, wherein
the start condition for the second mode operation is set based on a duration of the first mode operation.

13. The milling processing method according to claim 10, wherein
the ion milling device includes a sensor configured to measure an amount of sputter particles flicked by irradiating the all-solid-state battery with the ion beam, and
the start condition for the second mode operation is set based on an output of the sensor.

14. The milling processing method according to claim 13, further comprising:
determining ending of the milling processing of the all-solid-state battery based on the output of the sensor.

15. An ion milling device comprising:
a sample stage on which a sample is placed;
an ion source configured to emit an unfocused ion beam toward the sample;
a control device configured to mill the sample; and
a sensor including a quartz resonator and an oscillation circuit that oscillates the quartz resonator and outputs an oscillation signal, wherein
the control device measures, based on a change in a frequency of the oscillation signal due to deposition of sputter particles on the quartz resonator by the milling processing, a mass of the sputter particles deposited on the quartz resonator.

16. The ion milling device according to claim 15, wherein
the control device mills the sample in a first mode operation and a second mode operation in which ion beam currents of the ion beam are different, and
the control device sets a condition for starting the second mode operation and a time for executing the second mode operation based on an output of the sensor.

* * * * *